(12) United States Patent
Zuffada et al.

(10) Patent No.: US 9,018,984 B2
(45) Date of Patent: Apr. 28, 2015

(54) DRIVER FOR HIGH SPEED ELECTRICAL-OPTICAL MODULATOR INTERFACE

(71) Applicant: STMicroelectronics S.r.l., Agrate Brianza (IT)

(72) Inventors: Maurizio Zuffada, Milan (IT); Enrico Stefano Temporiti Milani, Pavia (IT); Antonio Fincato, Cameri (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 14/160,921

(22) Filed: Jan. 22, 2014

(65) Prior Publication Data

US 2014/0218073 A1    Aug. 7, 2014

(30) Foreign Application Priority Data

Feb. 1, 2013    (IT) ................................ MI2013A0143

(51) Int. Cl.
| | |
|---|---|
| *H03K 17/10* | (2006.01) |
| *H03K 3/012* | (2006.01) |
| *H03K 19/0175* | (2006.01) |
| *H03K 17/0416* | (2006.01) |
| *H03F 3/45* | (2006.01) |

(52) U.S. Cl.
CPC ............ *H03K 3/012* (2013.01); *H03K 19/0175* (2013.01); *H03K 17/0416* (2013.01); *H03K 17/10* (2013.01); *H03F 3/4508* (2013.01); *H03F 2203/45318* (2013.01); *H03F 2203/45394* (2013.01)

(58) Field of Classification Search
CPC ... H03K 3/012; H03K 17/10; H03K 17/0416; H03K 19/0175; H03F 3/4508; H03F 2203/45394; H03F 2203/45318
USPC ............ 327/108, 109, 110, 112, 52, 65, 103, 327/427, 434, 478

See application file for complete search history.

(56) References Cited

U.S. PATENT DOCUMENTS

| | | |
|---|---|---|
| 5,177,377 A | 1/1993 | Mathuda et al. |
| 5,355,032 A | 10/1994 | Rogers et al. |
| 7,039,258 B2 | 5/2006 | Gunn, III et al. |
| 7,450,787 B2 | 11/2008 | Kucharski et al. |
| 7,515,775 B1 | 4/2009 | Kucharski et al. |
| 7,899,276 B2 | 3/2011 | Kucharski et al. |
| 2002/0159665 A1 | 10/2002 | Burie et al. |
| 2007/0096780 A1* | 5/2007 | White .......................... 327/112 |
| 2009/0201052 A1 | 8/2009 | Sanduleanu et al. |

(Continued)

OTHER PUBLICATIONS

Mohan et al., "Bandwidth Extension in CMOS with Optimized On-Chip Inductors," IEEE Journal of Solid-State Circuits, vol. 35, No. 3, Mar. 2000, pp. 346-355.

(Continued)

*Primary Examiner* — Jung Kim
(74) *Attorney, Agent, or Firm* — Allen, Dyer, Doppelt, Milbrath & Gilchrist, P.A.

(57) ABSTRACT

An electrical-optical modulator may function at high data rates and may be realized in comparably low cost silicon base technology, typically in BJT, BiCMOS or CMOS technologies. The output signal path may include a high transition frequency BJT and by using an active load constituted by a MOS driven by an inverted version of the modulating signal that drives the BJT, the falling edge of the output signal is sped up.

20 Claims, 2 Drawing Sheets

(56) References Cited

U.S. PATENT DOCUMENTS

2011/0133773 A1  6/2011  Shau
2014/0306737 A1* 10/2014  Mukherjee et al. ........... 327/108

OTHER PUBLICATIONS

Long et al., "Design of an Opto-Electronic Modulator Driver Amplifier for 40-Gb/s Data Rate Systems," Journal of Lightwave Technology, vol. 20, No. 12, Dec. 2002, pp. 2015-2021.

Analui et al "A Fuly Integrated 20-Gb/s Optoelectronic Transceiver Implemented in a Standard 0.13-nm CMOS SOI Technology," IEEE Journal of Solid-State Circuits, vol. 41, No. 12, Dec. 2006, pp. 2945-2955.

Dogru et al., "Ultra-Low Voltage Substrate-Removed Mach-Zehnder Intensity Modulators with Integrated Electrical Drivers," IEEE 2009, pp. 656-657.

Kim et al, "A 40-Gb/s Optical Transceiver Front-End in 45 nm SOI CMOS Technology," IEEE 2010, 4 pages.

Palaniappan et al., "Power Efficiency Comparisons of Interchip Optical Interconnect Architectures," IEEE Transactions on Circuits and Systems—II: Express Briefs, vol. 57, No. 5, May 2010, pp. 343-347.

* cited by examiner

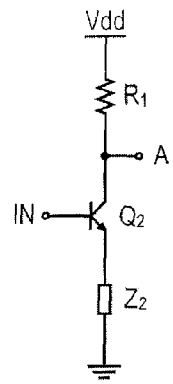
Fig. 4
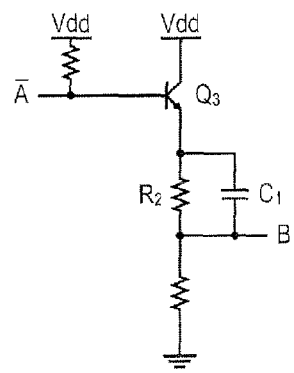 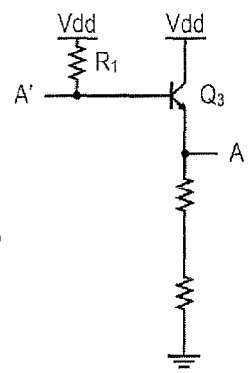 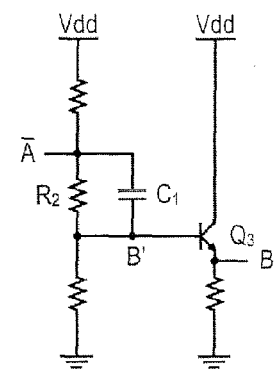
Fig. 5A    Fig. 5B    Fig. 5C
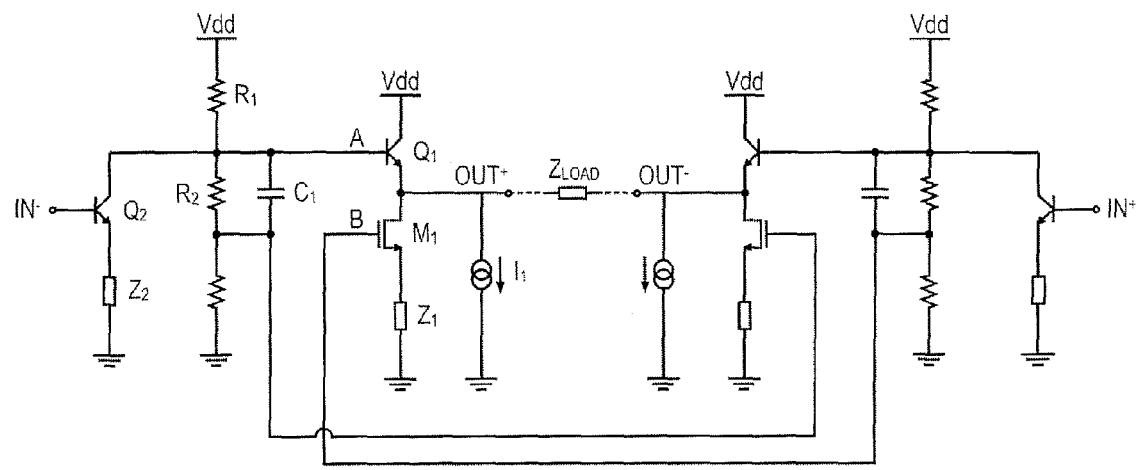
Fig. 6

DRIVER FOR HIGH SPEED ELECTRICAL-OPTICAL MODULATOR INTERFACE

TECHNICAL FIELD

This disclosure relates to electrical-optical (E-O) modulator interfaces for high speed communication systems, and in particular, to integrated E-O interfaces.

BACKGROUND

E-O interfaces are used in high speed communication systems to convert an electrical signal into a light signal. Typically, an E-O interface includes a driver stage controlled by voltage signals produced in preceding electronic stages and capable to drive E-O coupling elements of the modulator with sufficiently large voltages and currents to modulate a continuous light wave propagating in an optical wave guide.

In high data rate (DR) applications, the driver stage of an E-O modulator may be of interest since it must provide large output voltage levels with steep rising and falling edges in order to ensure proper operation without degrading the Inter-Symbol Interference (ISI) of a transmitted bit stream. At the same time, the final power stage may have reduced power dissipation, since it contributes significantly to the overall power budget of a typical optical link.

In order to meet these guidelines, high speed final driver stage implementations for data rates equal to or greater than 25 Gbps rely on the use of comparably expensive materials, such as Gallium Arsenide, Indium Phosphide, Indium Gallium Arsenide, or on expensive technological platforms, such as Silicon-On-Insulator (SOI) (See A 40-Gb/s Optical Transceiver Front-End in 45 nm SOI CMOS, Joohwa Kim; Buckwalter, J. F., IEEE Journal of Solid-State Circuits, Vol. 47, 2012, Page(s): 615-626; Design of an opto-electronic modulator driver amplifier for 40-Gb/s data rate systems, Long, A.; Buck, J.; Powell, R., Journal of Lightwave Technology, Volume: 20, 2002 Page(s): 2015-2021; Ultra-low voltage substrate-removed mach-zehnder intensity modulators with integrated electrical drivers, Dogru, S.; JaeHyuk Shin; Dagli, N., LEOS Annual Meeting Conference Proceedings, 2009. LEOS '09. IEEE, Page(s): 656-657; A Fully Integrated 20-Gb/s Optoelectronic Transceiver Implemented in a Standard 13-CMOS SOI Technology, Analui, B.; Guckenberger, D.; Kucharski, D.; Narasimha, A., IEEE Journal of Solid-State Circuits, Volume: 41, 2006, Page(s): 2945-2955; Power Efficiency Comparisons of Interchip Optical Interconnect Architectures, Palaniappan, A.; Palermo, S., IEEE Transactions on Circuits and Systems II: Express Briefs, Volume: 57, Publication Year: 2010, Page(s): 343-347) and use comparably large voltage supplies, up to 5V. Only recently, silicon complementary metal-oxide-semiconductor (CMOS) or BiCMOS implementations have been developed and proposed as viable low cost alternatives (See U.S. Pat. Nos. 7,899,276, 7,515,775, 7,450,787, and 7,039,258.)

SUMMARY

A high speed driver provides an approach to the above discussed guidelines for an electrical-optical modulator to function at high data rates and being realized even in comparably low cost silicon base technology, typically in bipolar junction transistor (BLIT), BiCMOS or CMOS technologies, and requiring relatively low supply voltages (e.g. 2.5V-3.3V).

The circuit may provide excellent performance in terms of rise times and fall times of the voltage signals applied by the final power stage to the elements of electro-optical coupling of the E-O interface of the modulator and can be used for both digital modulation schemes (e.g. on-off keying (OOK)) and analog modulation schemes (e.g. quadrature phase-shift keying (QPSK)). In some embodiments, the high speed driver may be realized in fully integrated E-O interfaces, e.g. on a silicon photonics platform (either with monolithic integration of electronics with photonics, or with two die, one dedicated to electronics and one to photonics, assembled in the same package), but it is useful also for technological platforms other than based on silicon wafers (e.g. GaAs, InP, InGaAs, SOI).

The driver may be suitable for any kind of light wave modulator (e.g. Mach Zendher, Ring Resonator, Electro Absorption Modulator). Instead of realizing a single driver, the driver can even be split in several stages for implementing a distributed E-O modulator structure. Use of integrated transmission lines for connecting the driver to distributed replicas of final power stages of corresponding distributed E-O interfaces may allow a precise equalization to the optical delay of the light propagating within the waveguide modulator of the delay of the electrical signal propagating toward the final power stages of the driver.

BRIEF DESCRIPTION OF THE DRAWINGS

FIG. 4 shows an exemplary embodiment of a BiCMOS pre-driver stage, according to the present disclosure.

FIGS. 5A-5C shows exemplary embodiments of an intermediate buffer stage for the embodiment of FIG. 4.

FIG. 6 shows an exemplary embodiment of the differential application of the driver, according to the present disclosure.

DETAILED DESCRIPTION OF THE PREFERRED EMBODIMENTS

For the sake of simplicity, several exemplary embodiments of the driver illustrated in the attached drawings and described in detail contemplate a single ended driven load. As will be appreciated by the skilled person, the typical circuit topology in high speed communication systems is a differential (or pseudo-differential) configuration using a differential (or pseudo-differential) version of the driver.

Figure 1:
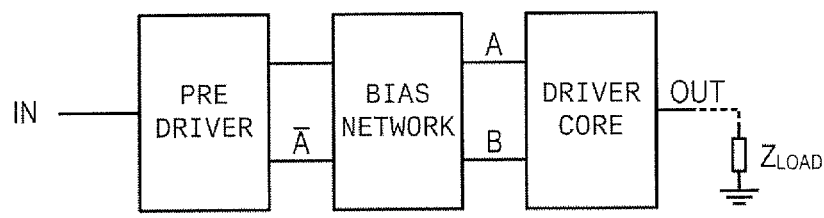
FIG. 1 is a schematic block diagram of the driver, according to the present disclosure.
Figure 2:
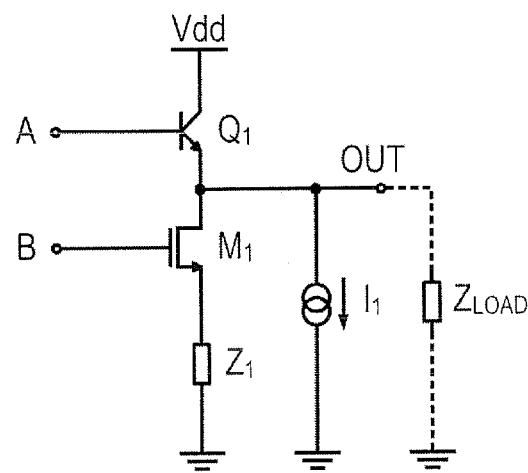
FIG. 2 shows an exemplary single-ended BiCMOS embodiment.

A high level block diagram of the driver of this disclosure according to an embodiment is shown in FIG. 1. For a BiCMOS implementation, the driver core (i.e. basically the final power stage connected to the driven load) may basically be realized as shown in FIG. 2. The A-OUT path is the main signal path through a high transition frequency BJT, Q1, intrinsically capable of switching at the high speed contemplated by the application. However, the load of the final power stage Q1 if typically implemented with a static load element or with a current generator would result in a fast switching at the rising edge but in a relatively slow switching at the falling edge. This is effectively avoided by introducing the MOS M1, driven by an inverted version B of the modulating A signal that drives Q1, that speeds up the falling edge of the output signal OUT.

The load Z1 on the M1 source may be properly sized for optimal performance: in a basic topology, it may be just a short circuit, but it may be, for example, a resistance with a capacitance in parallel, for simultaneously ensuring proper biasing conditions and enhanced high frequency operation. A current generator I1 may be used to ensure proper Q1 biasing.

Figure 3:
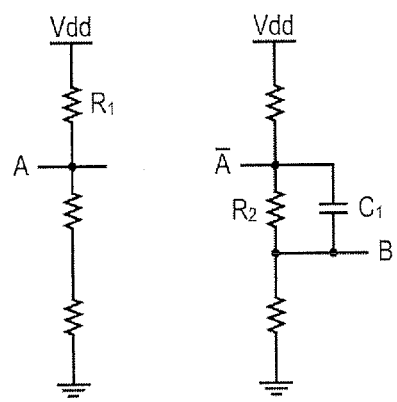
FIG. 3 shows an exemplary bias network for the two transistors of the final power stage of the driver, according to the present disclosure.

FIG. 3 depicts exemplary alternative input bias networks for properly biasing both Q1 and M1. Since the M1 contribution to the driver operation is mainly to speed up switching at the falling edge of the output signal OUT, in the example implementation, a capacitance C1 can be used in parallel with R2 to provide a proper high frequency signal feeding at the M1 input.

Since the AC gain of the driver core is ~1, a dedicated input gain stage can optionally be added to achieve the desired overall gain and at the same time to ensure a proper level shifting if needed. Such a pre-driver stage is much less critical than the driver core because of the much lower capacitive load that it must drive and thus can be realized, for example, as shown in FIG. 4, i.e. sharing R1 as its output load.

The load Z2 on the Q2 emitter may be properly sized for optimizing performance: in its basic and simplest topology it can be just a short circuit, but it can be, for example, a resistance or a current generator in order to control better the biasing conditions of Q2. It should be remarked that the use of a MOS transistor M1 for speeding up the switching at falling edges is particularly suitable for low supply voltage implementations, but its function may be implemented as well with a BJT.

Optionally, in order to further optimize high frequency operation of the driver circuit, an intermediate buffer stage can be introduced, as depicted in the alternative exemplary topologies of FIGS. 5A-5C. Peaking techniques (e.g. series peaking/shunt peaking) can be implemented on any intermediate node to further increase the slope of the rising and falling edges.

As already noted, the differential embodiment for high speed communication systems, implementing the same functional circuit topologies described above, is a differential (or pseudo-differential) configuration.

An exemplary differential embodiment of the driver circuit is shown in FIG. 6. In the depicted differential embodiment, the signal inverting operation at the gate of M1 is intrinsically accomplished by the differential version, as shown in FIG. 6. This avoids possible delays, intrinsic in the single-ended inverting operation, between the switching edges of A and B signals. In addition, both the load on the Q2 emitter and the load on the M1 source can be shared. Moreover, the differential driver circuit, similarly to the single ended version, may include intermediate buffer stages for incrementing the overall gain.

The load Zload can be split in two series contributions, e.g. in case coupling elements of the E-O modulator interface must be driven with opposite polarities. A pseudo-differential version of the circuit can be obtained by connecting the intermediate node at a fixed voltage level (e.g. gnd). In some embodiments, a pure MOS implementation of the driver circuit is possible by replacing the BJT transistors with MOS ones. Nevertheless, the unique circuit features of the driver of this disclosure also remain valid and advantageous for a pure BJT implementation or for implementation in technological platforms other than silicon based ones (e.g. GaAs, InP, InGaAs) and SOI.

The embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

That which is claimed is:

1. An electronic device comprising:
    an electrical-optical (E-O) interface, said E-O interface comprising a coupling element; and
    a driver circuit configured to drive said coupling element and comprising
        a power stage transistor comprising a control terminal configured to be driven by a modulating voltage signal, and a conduction terminal to be coupled to the coupling element of the E-O interface,
        a second transistor coupled in series with said power stage transistor and comprising a control terminal configured to be driven by an inverted replica of the modulating voltage signal,
        a load impedance coupled between said second transistor and a reference voltage, and
        a biasing circuit for said power stage transistor and coupled between said conduction terminal of said power stage transistor and the reference voltage.

2. The electronic device of claim 1 wherein said power stage transistor comprises a bipolar junction transistor; and wherein said second transistor comprises a metal-oxide semiconductor (MOS) transistor.

3. The electronic device of claim 1 wherein said power stage transistor comprises a bipolar junction transistor; and wherein said biasing circuit comprises a current generator coupled between said conduction terminal of said power stage transistor and the reference voltage.

4. The electronic device of claim 1 wherein the coupling element of the E-O interface comprises at least one electrode for an optical waveguide.

5. The electronic device of claim 4 wherein the at least one electrode is coupled to an integrated optical waveguide with reverse biased junctions.

6. The electronic device of claim 1 further comprising a plurality of passive direct current (DC) bias networks coupled to said control terminal of said power stage transistor and said control terminal of said second transistor, and a capacitor configured to feed a high frequency signal to said second transistor.

7. The electronic device of claim 1 further comprising an input signal gain stage coupled to said power stage transistor.

8. The electronic device of claim 1 further comprising a differential power stage transistor cooperating with said power stage transistor and configured to drive the coupling element in a differential mode, thereby reducing delays between switching edges of the modulating voltage signal and the inverted replica of the modulating voltage signal.

9. The electronic device of claim 1 further comprising a pre-driver configured to process a modulating input signal, and produce the modulating voltage signal and the inverted replica of the modulating voltage signal.

10. An electronic device comprising:
    a plurality of driver circuits, each driver circuit comprising
        a power stage transistor comprising a control terminal configured to be driven by a modulating voltage signal, and a conduction terminal,
        a second transistor coupled in series with said power stage transistor and comprising a control terminal configured to be driven by an inverted replica of the modulating voltage signal,
        a load impedance coupled between said second transistor and a reference voltage, and a biasing circuit for said power stage transistor and coupled between said conduction terminal of said power stage transistor and the reference voltage;

a waveguide of an electrical-optical (E-O) interface and comprising a plurality of coupling elements respectively coupled to said plurality of driver circuits;

a pre-driver; and a plurality of transmission lines coupling outputs of said pre-driver to respective inputs of the said plurality of driver circuits.

11. The electronic device of claim 10 wherein said power stage transistor comprises a bipolar junction transistor; and wherein said second transistor comprises a metal-oxide semiconductor (MOS) transistor.

12. The electronic device of claim 10 wherein said power stage transistor comprises a bipolar junction transistor; and wherein said biasing circuit comprises a current generator coupled between said conduction terminal of said power stage transistor and the reference voltage.

13. A method for making an electronic device, the method comprising:

coupling a coupling element of an electrical-optical (E-O) interface to a driver circuit of the electronic device;

coupling a power stage transistor comprising a control terminal to be driven by a modulating voltage signal, and a conduction terminal coupled to the coupling element of the E-O interface;

coupling a second transistor in series with the power stage transistor and comprising a control terminal to be driven by an inverted replica of the modulating voltage signal;

coupling a load impedance between the second transistor and a reference voltage; and coupling a biasing circuit for the power stage transistor between the conduction terminal of the power stage transistor and the reference voltage.

14. The method of claim 13 wherein the power stage transistor comprises a bipolar junction transistor; and wherein the second transistor comprises a metal-oxide semiconductor (MOS) transistor.

15. The method of claim 13 wherein the power stage transistor comprises a bipolar junction transistor; and wherein the biasing circuit comprises a current generator coupled between the conduction terminal of the power stage transistor and the reference voltage.

16. The method of claim 13 wherein the coupling element of the E-O interface comprises at least one electrode for an optical waveguide.

17. The method of claim 16 wherein the at least one electrode is coupled to an integrated optical waveguide with reverse biased junctions.

18. The method of claim 13 further comprising coupling a plurality of passive direct current (DC) bias networks to the control terminal of the power stage transistor and the control terminal of the second transistor.

19. The method of claim 13 further comprising coupling an input signal gain stage to the power stage transistor.

20. The method of claim 13 further comprising coupling a pre-driver to process a modulating input signal, and produce the modulating voltage signal and the inverted replica of the modulating voltage signal.

* * * * *